(12) United States Patent
Chen et al.

(10) Patent No.: US 8,009,260 B2
(45) Date of Patent: Aug. 30, 2011

(54) FLEXIBLE PRINTED CIRCUIT AND LIQUID CRYSTAL MODULE USING THE SAME

(75) Inventors: Ming-Da Chen, Taichung County (TW); Ping-Yu Liang, Taichung (TW); Chin-Liang Chen, Taichung (TW)

(73) Assignee: Wintek Coropration, Taichung (TW)

( * ) Notice: Subject to any disclaimer, the term of this patent is extended or adjusted under 35 U.S.C. 154(b) by 242 days.

(21) Appl. No.: 12/504,730

(22) Filed: Jul. 17, 2009

(65) Prior Publication Data

US 2010/0014016 A1    Jan. 21, 2010

(30) Foreign Application Priority Data

Jul. 17, 2008  (TW) ............................. 97212787 U

(51) Int. Cl.
*G02F 1/1345* (2006.01)
(52) U.S. Cl. ............................. 349/152; 349/58; 349/62
(58) Field of Classification Search .................... 349/152
See application file for complete search history.

(56) References Cited

U.S. PATENT DOCUMENTS 7,852,425 B2 * 12/2010 Nishimura ....................... 349/58
7,898,611 B2 *  3/2011 Yu et al. .......................... 349/58

* cited by examiner

*Primary Examiner* — Richard H Kim
(74) *Attorney, Agent, or Firm* — Thomas|Kayden

(57) ABSTRACT

A flexible printed circuit used for being disposed between a frame and a conductive casing of a liquid crystal module is provided. The frame includes a main plate and a side plate which is connected to a side of the main plate. The flexible printed circuit includes a body and a grounding portion. The body is used for being disposed on the main plate of the frame. The grounding portion extends from the body. The grounding portion is bent to a predetermined angle with respect to the body, so that the grounding portion is disposed on the side plate of the frame. The grounding portion has a metal layer contacting an inner wall of a side plate of the conductive casing. The flexible printed circuit has a hole located at the position where the grounding portion is connected the body.

10 Claims, 9 Drawing Sheets

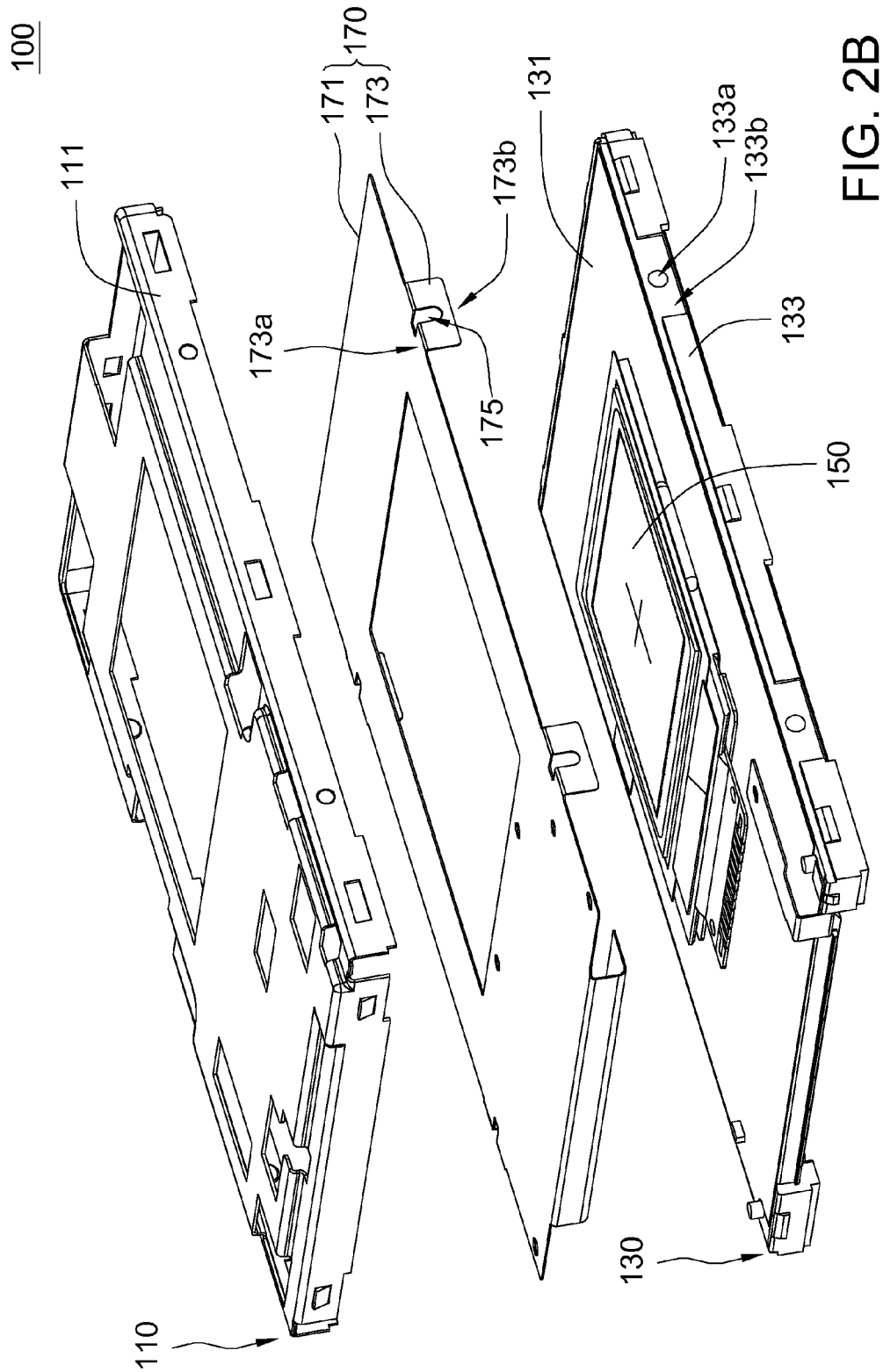

FLEXIBLE PRINTED CIRCUIT AND LIQUID CRYSTAL MODULE USING THE SAME

This application claims the benefit of Taiwan application Serial No. 97212787, filed Jul. 17, 2008, the subject matter of which is incorporated herein by reference.

BACKGROUND OF THE INVENTION

1. Field of the Invention

The invention relates in general to a flexible printed circuit and a liquid crystal module using the same, and more particularly to a flexible printed circuit having an electrostatic shielding mechanism and a liquid crystal module using the same.

2. Description of the Related Art

Generally, electrostatic discharge (ESD) would damage components inside electronic devices or make the electronic devices malfunction. Therefore, a shielding mechanism is provided in the electronic devices so as to reduce ESD events. A shielding mechanism of a liquid crystal module is disclosed below for exemplification.

Referring to FIG. 1A and FIG. 1B respectively, an iron frame of a conventional liquid crystal module is shown in FIG. 1A, and a side view of the iron frame in FIG. 1A being grounded by contacting a flexible printed circuit is shown in FIG. 1B. The iron frame 10 has a body 11 and an elastic piece 13. A part of the body 11 is removed, so that the elastic piece 13 is bent and protrudes from the body 11. As indicated in FIG. 1 B, an end of the elastic piece 13 is bent once again and grounded by surface contacting a flexible printed circuit 20 in the liquid crystal module 50. Thus, electrostatic charges are discharged from the liquid crystal module 50.

However, as the part of the iron frame 10 is removed (as indicated in FIG. 1A) to form the elastic piece 13, the structural strength of the iron frame 10 is reduced. Referring to FIG. 1C, particles located between the elastic piece and the flexible printed circuit in FIG. 1B are shown. When particles 30, such as dust, are located between the elastic piece 13 and the flexible printed circuit 20, the elastic piece 13 can not exactly contact the flexible printed circuit 20 so as to affect the grounding effect. Furthermore, as the elastic piece 13 is a bent structure and has elasticity, the elastic piece 13 would easily be moved due to the vibration of the liquid crystal module 50. Consequently, the elastic piece 13 can not exactly contact the flexible printed circuit 20 so as to reduce the grounding effect.

In addition, conventionally, the flexible printed circuit and the iron frame are connected by way of soldering to be grounded to discharge electrostatic charges; or a conductive foam is disposed in the liquid crystal module to discharge electrostatic charges. However, soldering not only increases working hours but is normally hard to re-process. The disposition of the conductive foam in the liquid crystal module not only increases the thickness of the liquid crystal module, but also increases working hours and cost. Thus, how to effectively avoid ESD events occurring to the liquid crystal module so as to correspondingly increase the lifespan of the liquid crystal module has become an imminent issue to manufacturers.

SUMMARY OF THE INVENTION

The invention is directed to a flexible printed circuit and a liquid crystal module using the same. The influence of electrostatic charges on the liquid crystal module is reduced through the contact between a grounding portion of the flexible printed circuit and a conductive casing. Thus, compared with the conventional electrostatic shielding mechanism (for example, the grounding is achieved through an elastic piece of an iron frame, soldering or disposing a conductive foam), the present invention can effectively reduce the influence of electrostatic charges on the liquid crystal module, so that the lifespan of the liquid crystal module is correspondingly prolonged.

According to a first aspect of the present invention, a flexible printed circuit used for being disposed between a frame and a conductive casing of a liquid crystal module is provided. The frame includes a main plate and a side plate which is connected to a side of the main plate. The flexible printed circuit includes a body and a grounding portion. The body is used for being disposed on the main plate of the frame. The grounding portion extends from the body. The grounding portion is bent to a predetermined angle with respect to the body, so that the grounding portion is disposed on the side plate of the frame. The grounding portion has a metal layer contacting an inner wall of a side plate of the conductive casing. The flexible printed circuit has a hole located at the position where the grounding portion is connected to the body.

According to a second aspect of the present invention, a flexible printed circuit used for being disposed in a liquid crystal module is provided. The liquid crystal module includes a frame, a first conductive casing and a second conductive casing. The frame, the second conductive casing, the flexible printed circuit and the first conductive casing are stacked in order. The second conductive casing includes a main plate and a side plate which is connected to a side of the main plate. The flexible printed circuit includes a body and a grounding portion. The body is used for being disposed on the main plate of the second conductive casing. The grounding portion extends from the body. The grounding portion is bent to a predetermined angle with respect to the body, so that the grounding portion is disposed on the side plate of the second conductive casing. The grounding portion has a metal layer. The metal layer contacts at least one of an inner wall of a side plate of the first conductive casing and an outer wall of the side plate of the second conductive casing. The flexible printed circuit has a hole located at the position where the grounding portion is connected to the body.

According to a third aspect of the present invention, a liquid crystal module is provided. The liquid crystal module includes a frame, a display panel, a first conductive casing and a flexible printed circuit. The frame includes a main plate and a side plate which is connected to a side of the main plate. The display panel is disposed in the frame. The flexible printed circuit is disposed between the frame and the first conductive casing. The flexible printed circuit includes a body and a grounding portion. The body is disposed on the main plate of the frame. The grounding portion has a first end and a second end. The first end of the grounding portion is connected to the body. A part of the grounding portion is bent, so that the second end of the grounding portion is disposed on the side plate of the frame. The grounding portion contacts an inner wall of a side plate of the first conductive casing. The flexible printed circuit has a first hole located at the position where the first end is connected to the body.

Any of the three disclosed structures can be disposed with two display panels which are respectively located on the two opposite sides of the frame to form a double-display module.

The invention will become apparent from the following detailed description of the preferred but non-limiting embodiments. The following description is made with reference to the accompanying drawings.

BRIEF DESCRIPTION OF THE DRAWINGS

FIG. 2B shows an explosion diagram of the liquid crystal module in FIG. 2A;

DETAILED DESCRIPTION OF THE INVENTION

The present invention provides a flexible printed circuit and a liquid crystal module using the same. Electrostatic charges are discharged from the liquid crystal module through the contact between a grounding portion of the flexible printed circuit and at least one conductive casing. A first embodiment and a second embodiment are disclosed below for elaborating the present invention. In the following embodiments, some components are omitted so as to highlight the technical features of the present invention.

First Embodiment

Figure 1A:
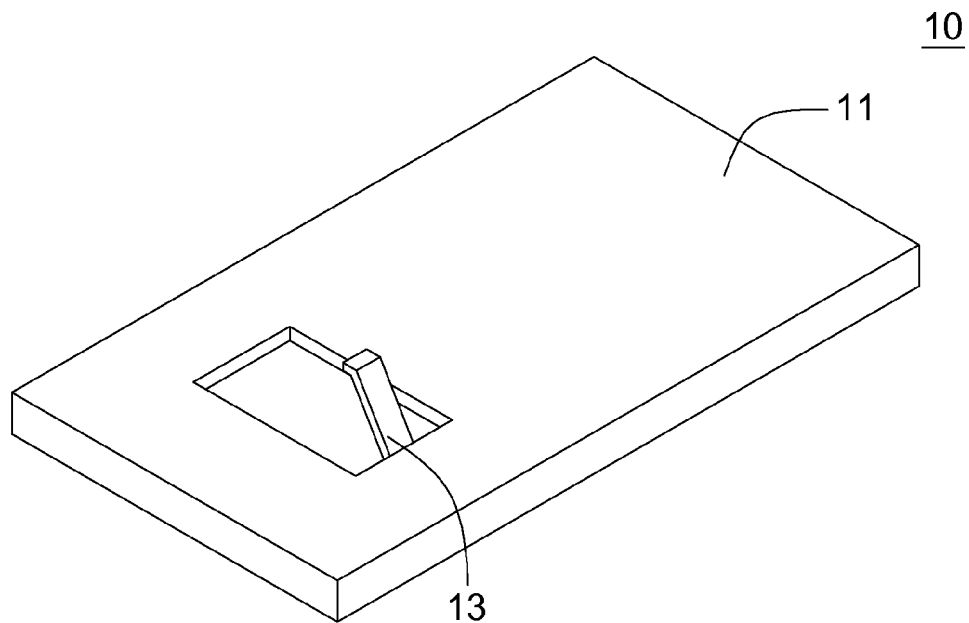
FIG. 1A (Prior Art) shows an iron frame of a conventional liquid crystal module.
Figure 1B:
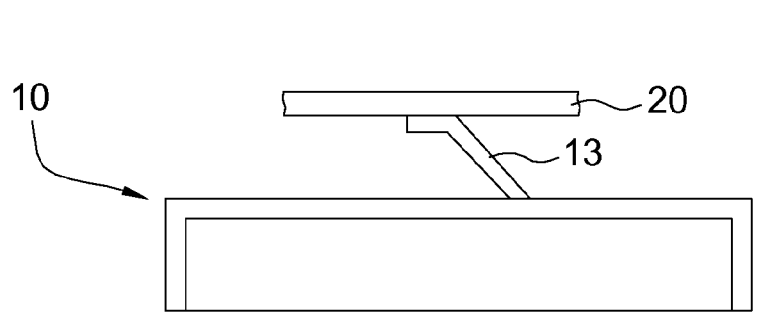
FIG. 1B (Prior Art) shows a side view of the iron frame in FIG. 1A being grounded by contacting a flexible printed circuit.
Figure 1C:
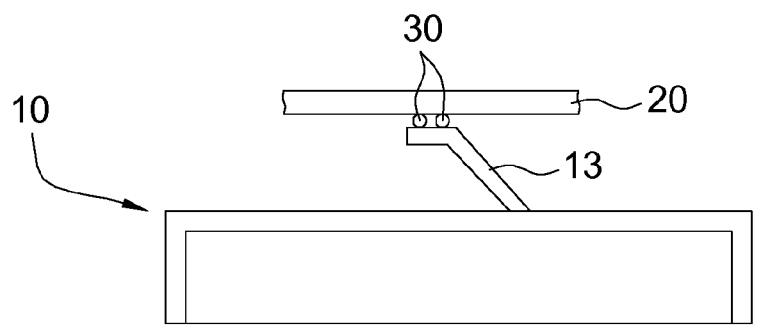
FIG. 1C (Prior Art) shows particles located between the elastic piece and the flexible printed circuit in FIG. 1B.
Figure 2A:
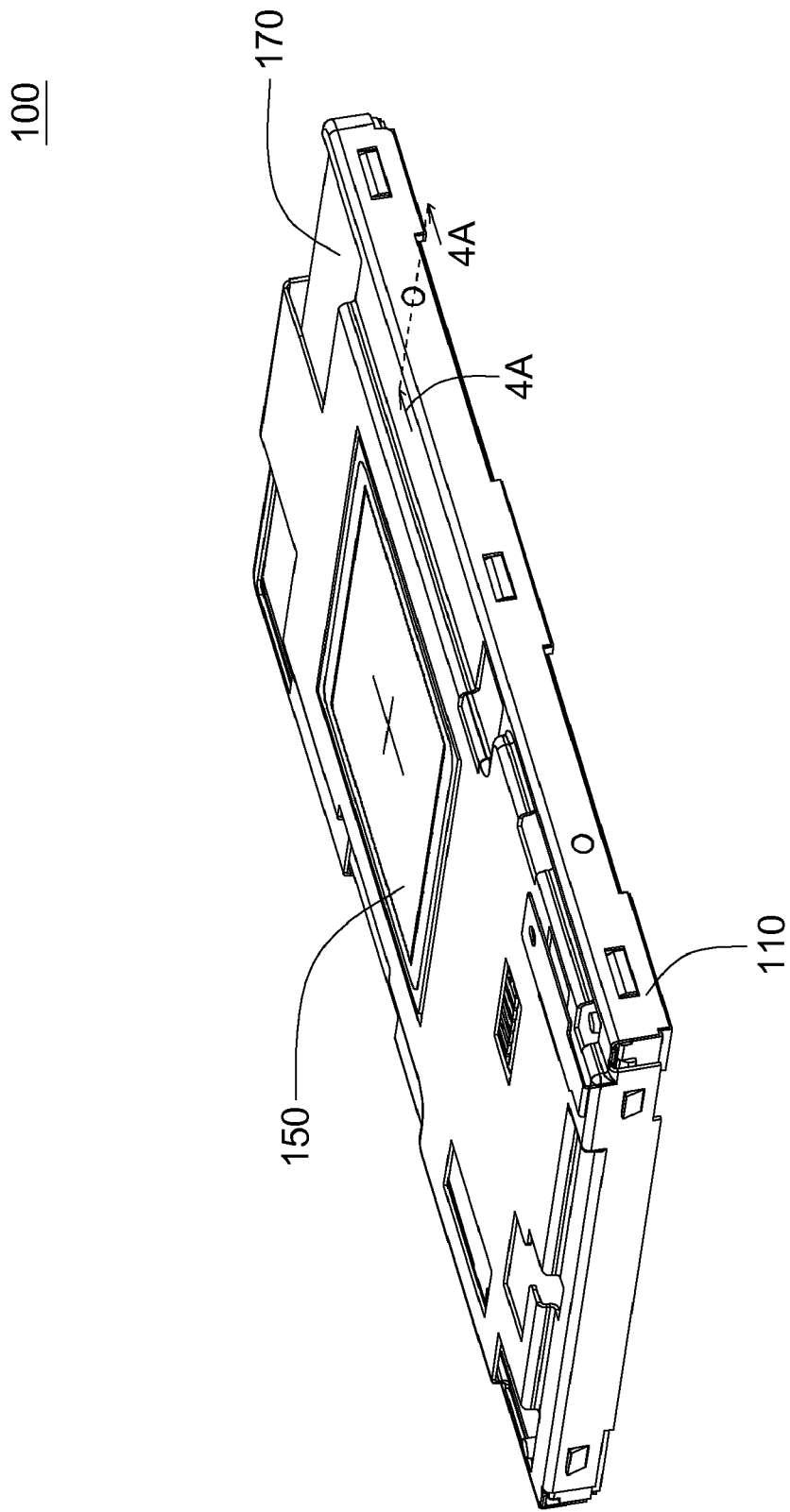
FIG. 2A shows a liquid crystal module according to a first embodiment of the present invention.

Referring to both FIG. 2A and FIG. 2B, a liquid crystal module according to a first embodiment of the present invention is shown, and an explosion diagram of the liquid crystal module in FIG. 2A is shown in FIG. 2B. The liquid crystal module 100 includes a frame 130 (as indicated in FIG. 2B), a display panel 150, a first conductive casing 110 and a flexible printed circuit 170.

As indicated in FIG. 2B, the display panel 150 is disposed in the frame 130. The flexible printed circuit 170 is disposed between the frame 130 and the first conductive casing 110. The frame 130 includes a main plate 131 and a side plate 133 which is connected to a side of the main plate 131. The flexible printed circuit 170 includes a body 171 and several grounding portions 173. Each grounding portion 173 extends from the body 171 and is bent to a predetermined angle with respect to the body 171. Despite the predetermined angle is 90 degrees in the present embodiment of the invention, the predetermined angle can be set according to the needs in actual situations and is not limited to 90 degrees. In addition, the number and the position of the grounding portions 173 are not limited to the above exemplification. As the grounding portions 173 of the present embodiment of the invention are the same, only one of the grounding portions 173 is illustrated in the following.

The body 171 is disposed on the main plate 131 of the frame 130. The grounding portion 173 has a first end 173a and a second end 173b. The first end 173a of the grounding portion 173 is connected to the body 131. A part of the grounding portion 173 is bent, so that the grounding portion 173 is located on the side plate 133 of the frame 130 and is grounded by contacting an inner wall of a side plate 111 of the first conductive casing 110.

Thus, when electrostatic charges exist in the liquid crystal module 100, the electrostatic charges are discharged through the path formed by the grounding portion 173 of the flexible printed circuit 170 and the first conductive casing 110. The situation that the lifespan of the liquid crystal module 100 is reduced because of the electrostatic charges can be reduced.

In addition, the flexible printed circuit 170 has a first hole 175. The first hole 175 is located at the bending part of the grounding portion 173 so as to avoid the stress being centered at the bending part of the grounding portion 173. Thus, the bounce possibility of the grounding portion 173 because of the bend can be reduced, so that the first conductive casing 110 is grounded by exactly contacting the grounding portion 173 of the flexible printed circuit 170. Preferably, the first hole 175 has a strip shape so as to reduce the situation that the stress is centered at the bending part of the grounding portion 173.

Figure 3:
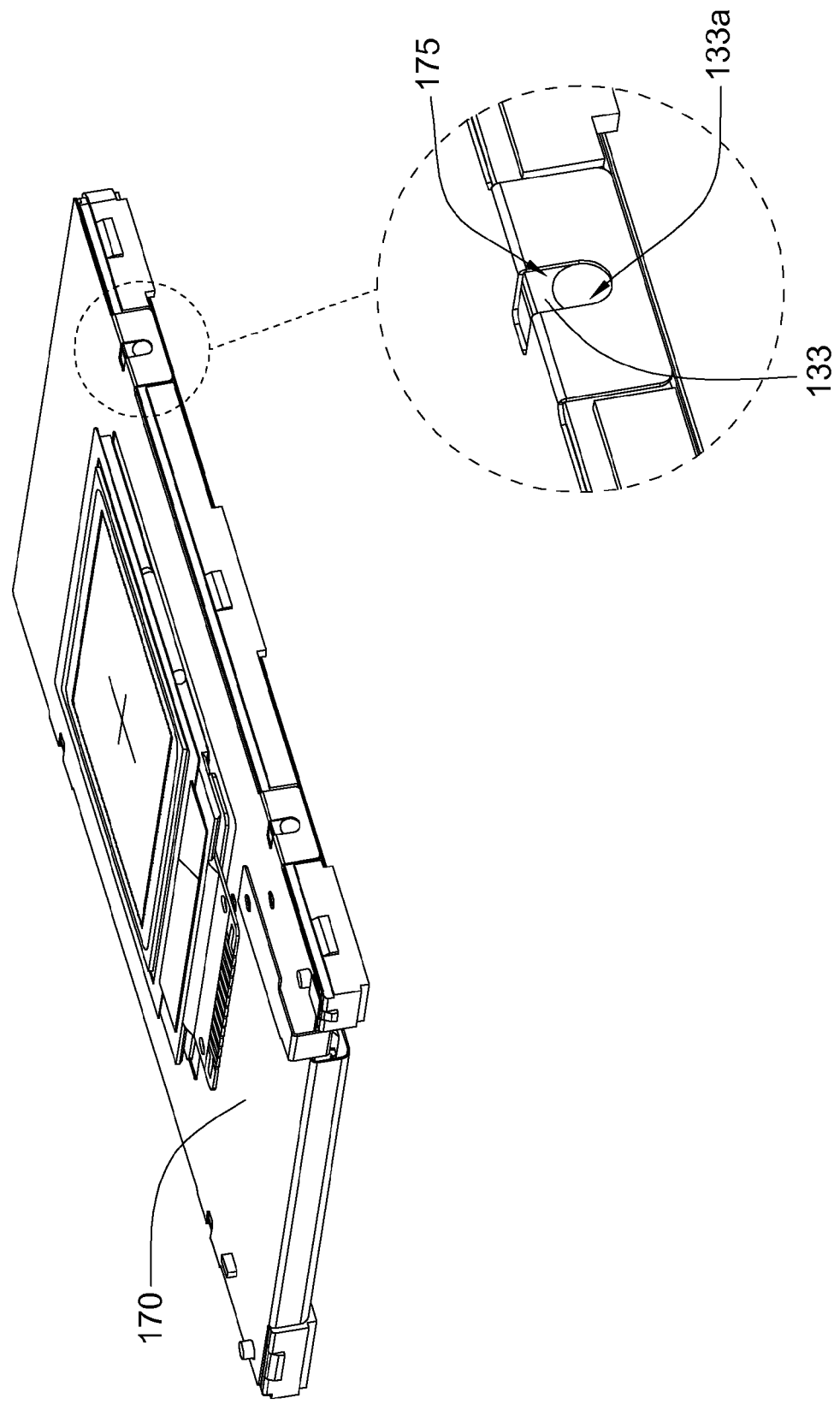
FIG. 3 shows the flexible printed circuit in FIG. 2B being disposed on the frame.
Figure 4A:
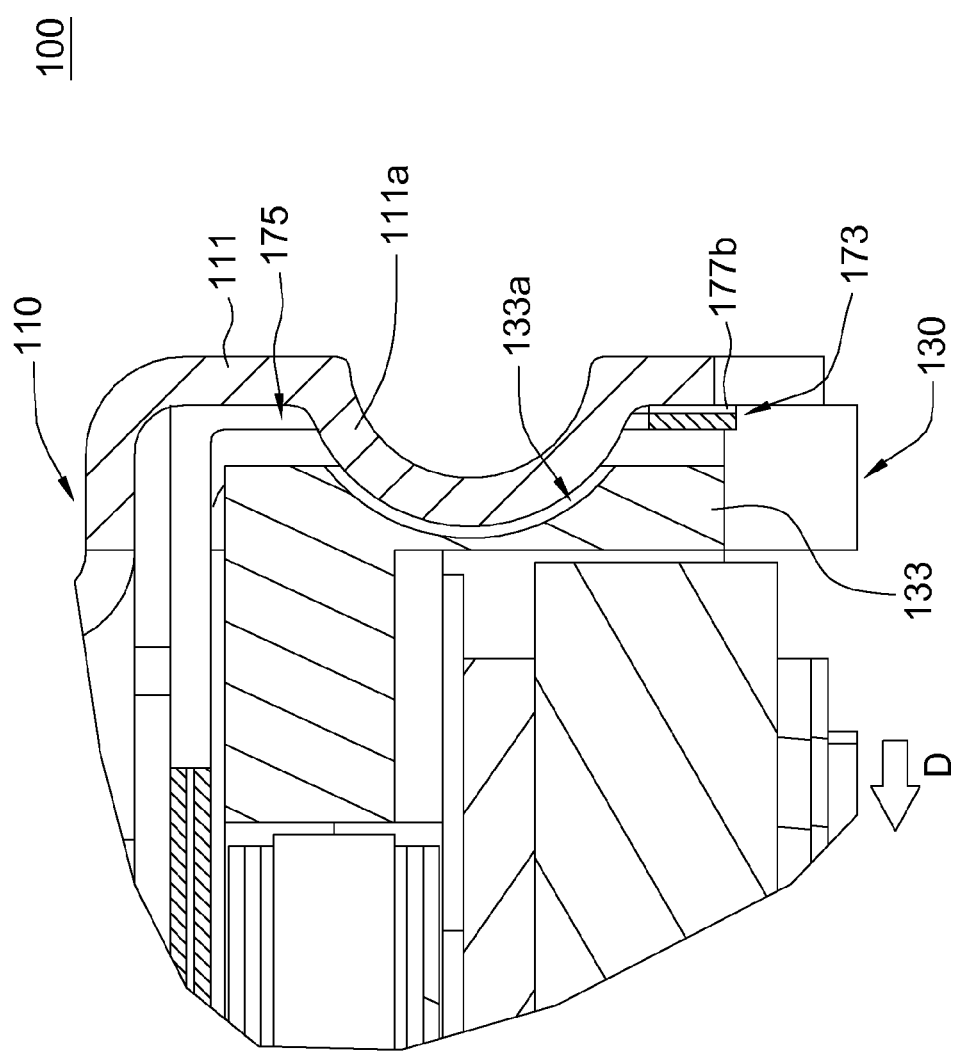
FIG. 4A shows a cross-sectional view of the liquid crystal module in FIG. 2A taken along line 4A-4A.

The liquid crystal module 100 of the present embodiment of the invention is further elaborated below. As indicated in FIG. 2B, the side plate 133 of the frame 130 has a recess 133b. The recess 133b is used for receiving the grounding portion 173 and further confirming if the grounding portion 173 is located at the predetermined position. Referring to FIG. 3, the flexible printed circuit in FIG. 2B being disposed on the frame is shown. The side plate 133 of the frame 130 (as indicated in FIG. 2B) has an indentation 133a exposed from the first hole 175 of the flexible printed circuit 170. Referring to FIG. 4A, a cross-sectional view of the liquid crystal module in FIG. 2A taken along line 4A-4A is shown. The side plate 111 of the first conductive casing 110 has a protrusion 111a protruding towards the side plate 133 of the frame 130 and passing through the first hole 175. The indentation 133a receives the protrusion 111a, so that the flexible printed circuit 170 is firmly fixed between the frame 130 and the first conductive casing 110 and is grounded by exactly contacting the first conductive casing 110.

Figure 4B:
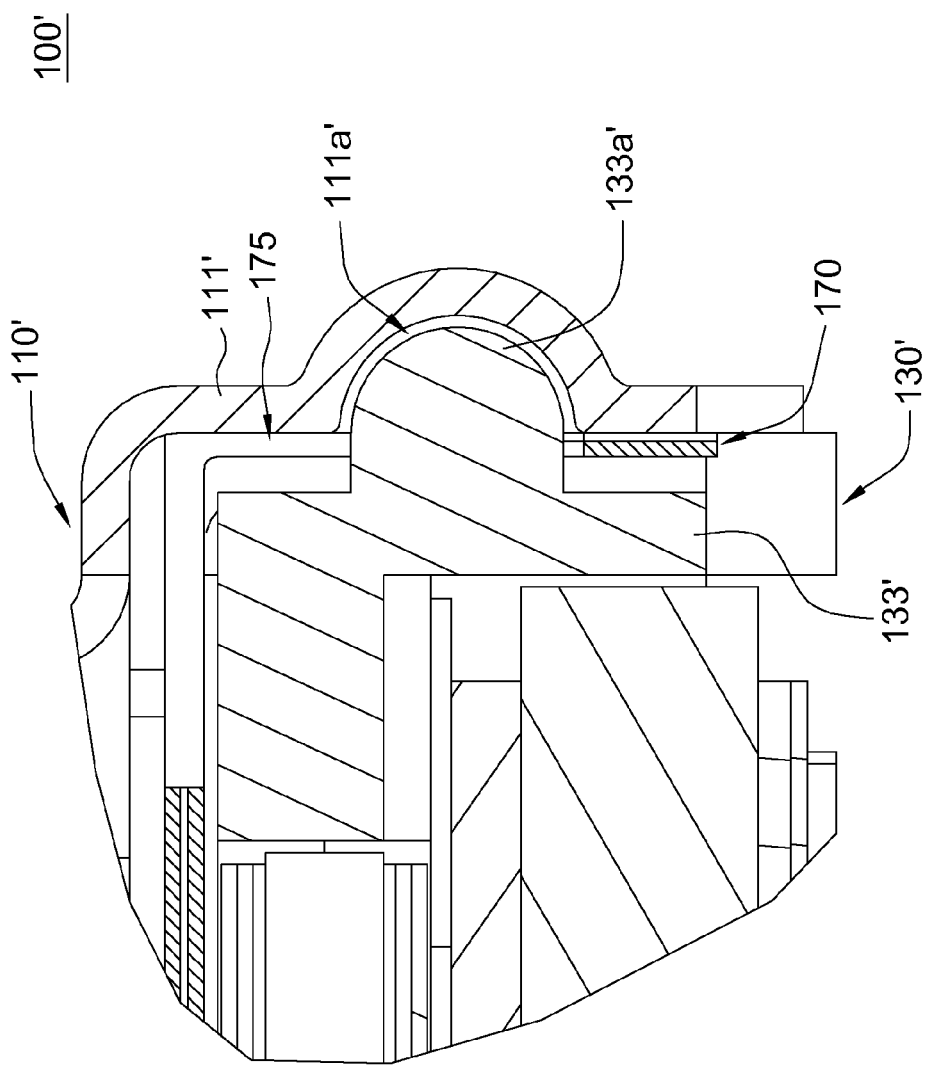
FIG. 4B shows a cross-sectional view of the assembly of another frame and another first conductive casing.

However, the disposition of the first conductive casing 110 and the frame 130 is not limited to the above exemplification. Referring to FIG. 4B, a cross-sectional view of the assembly of another frame and another first conductive casing is shown. The side plate 133' of the frame 130' of the liquid crystal module 100' has a protrusion 133a' exposed from the first hole 175. The protrusion 133a' protrudes towards the side plate 111' of the first conductive casing 110' and passes through the first hole 175. The side plate 111' of the first conductive casing 110' has an indentation 111a'. The indentation 111a' receives the protrusion 133a'. Thus, the flexible printed circuit 170 is fixed between the frame 130' and the first conductive casing 110', so that the flexible printed circuit 170 is grounded by exactly contacting the first conductive casing 110'.

As indicated in FIG. 4A, the grounding portion 173 includes a metal layer 177b. The metal layer 177b is made of copper, for example. The metal layer 177b contacts the inner wall of the side plate 111 of the first conductive casing 110. When electrostatic charges exist in the liquid crystal module 100, the electrostatic charges can be discharged through the path formed by the grounding portion 173 and the first conductive casing 110.

In order to further firmly fix the first conductive casing 110 onto the flexible printed circuit 170 so as to protect the components of the liquid crystal module 100 and provide the grounding effect, the side plate 111 of the first conductive casing 110 tilts towards the side plate 133 of the frame 130, that is, in the direction D shown in FIG. 4A. Thus, the first conductive casing 110 is fixed on the flexible printed circuit 170 in a manner similar to clamp the flexible printed circuit 170, and is grounded by tightly contacting the grounding portion 173 of the flexible printed circuit 170.

Despite the present embodiment of the invention includes several grounding portions 173, anyone who is skilled in the art should understand that the number and the position of the grounding portions 173 are not limited to the above exemplification. The grounding portions 173 can be disposed according to circuit layouts and the position where electrostatic charges might be generated, so that the electrostatic charges can be effectively discharged from the liquid crystal module 100 and the lifespan of the liquid crystal module 100 can be increased.

Second Embodiment

Figure 5A:
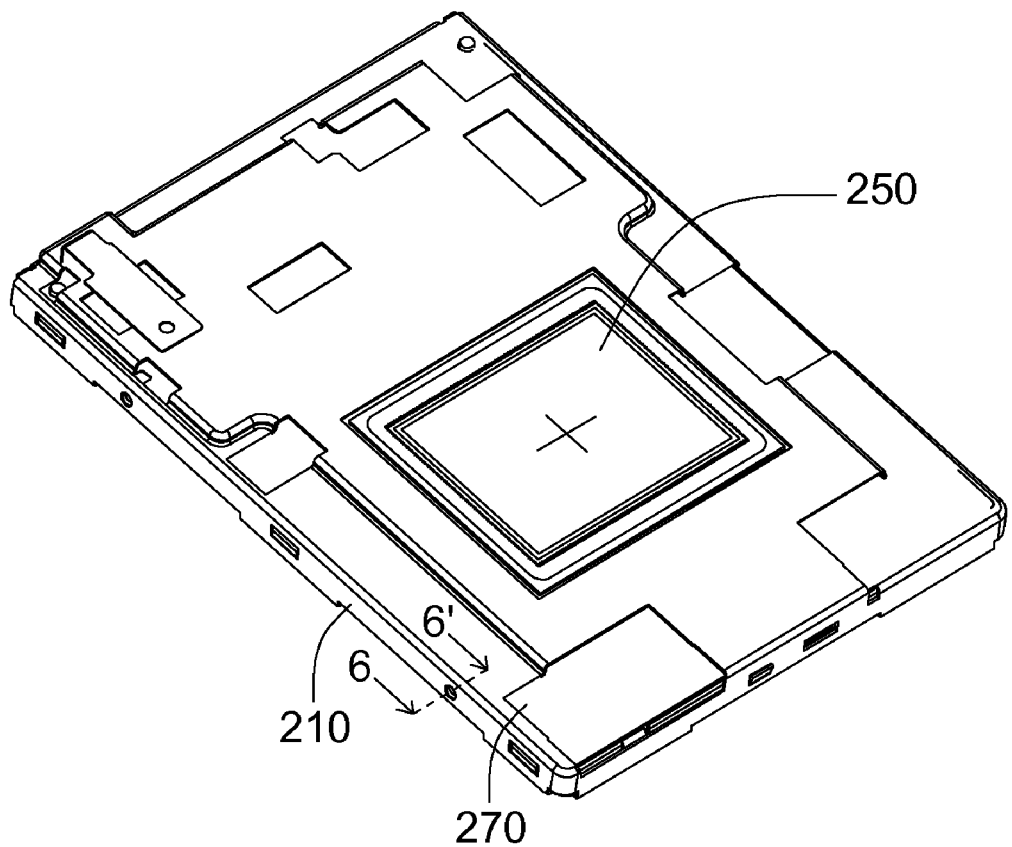
FIG. 5A a liquid crystal module according to a second embodiment of the present invention.
Figure 5B:
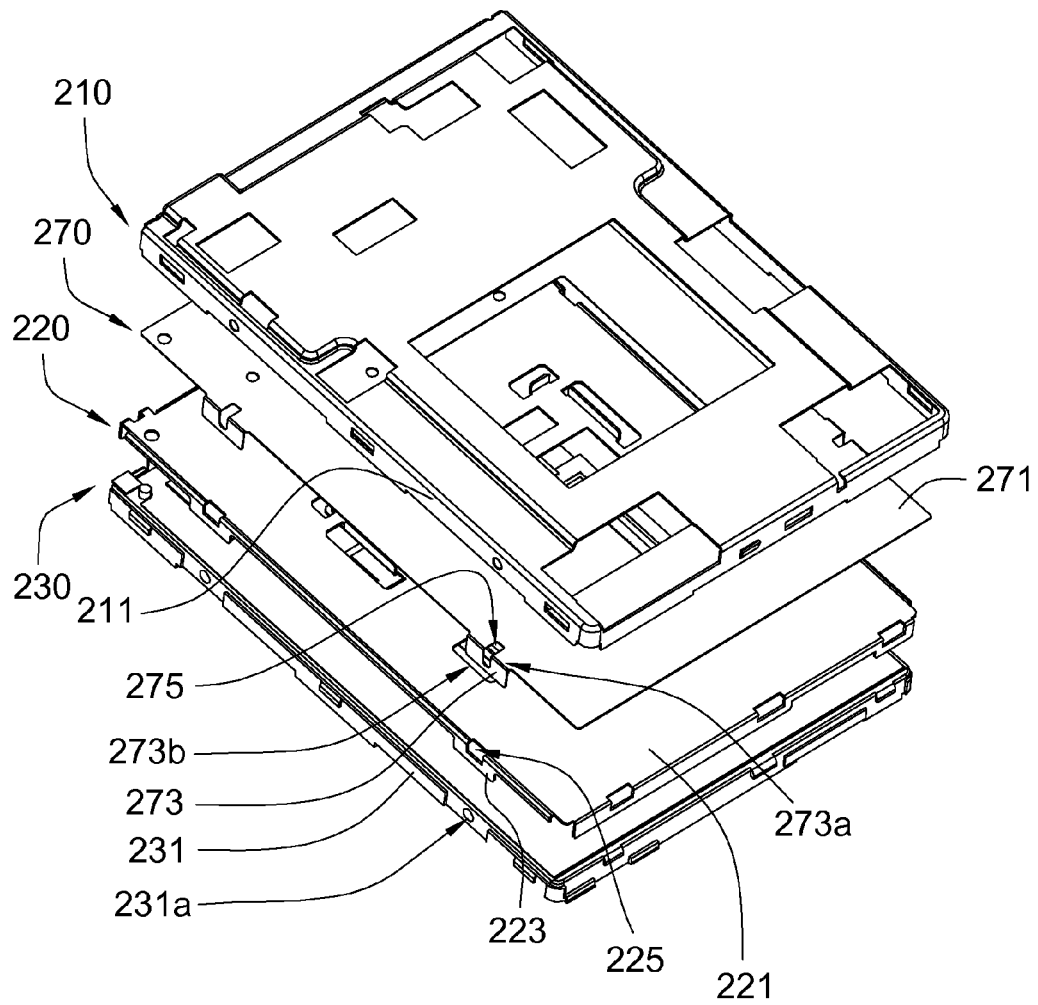
FIG. 5B shows an explosion diagram of the liquid crystal module in FIG. 5A.

Referring to both FIG. 5A and FIG. 5B, a liquid crystal module according to a second embodiment of the present invention is shown in FIG. 5A, and an explosion diagram of the liquid crystal module in FIG. 5A is shown in FIG. 5B. Compared with the first embodiment, the liquid crystal module 200 of the second embodiment further includes a second conductive casing 220. The frame 230, the second conductive casing 220, the flexible printed circuit 270 and the first conductive casing 210 are stacked in order. The display panel 250 is disposed in the frame 230.

The second conductive casing 220 includes a main plate 221 and a side plate 223 which is connected to a side of the main plate 221. The flexible printed circuit 270 includes a body 271 and several grounding portions 273. However, the number and the position of the grounding portions 273 are not limited to the above exemplification. As the grounding portions 273 of the present embodiment of the invention are the same, only one of the grounding portions 273 is illustrated in the following.

The body 271 is disposed on the main plate 221 of the second conductive casing 220. The grounding portion 273 has a first end 273a and a second end 273b. The first end 273a of the grounding portion 273 is connected to the body 271. A part of the grounding portion 273 is bent, so that the second end 273b of the grounding portion 273 is disposed on the side plate 223 of the second conductive casing 220 and the grounding portion 273 contacts an inner wall of a side plate 211 of the first conductive casing 210.

Figure 6:
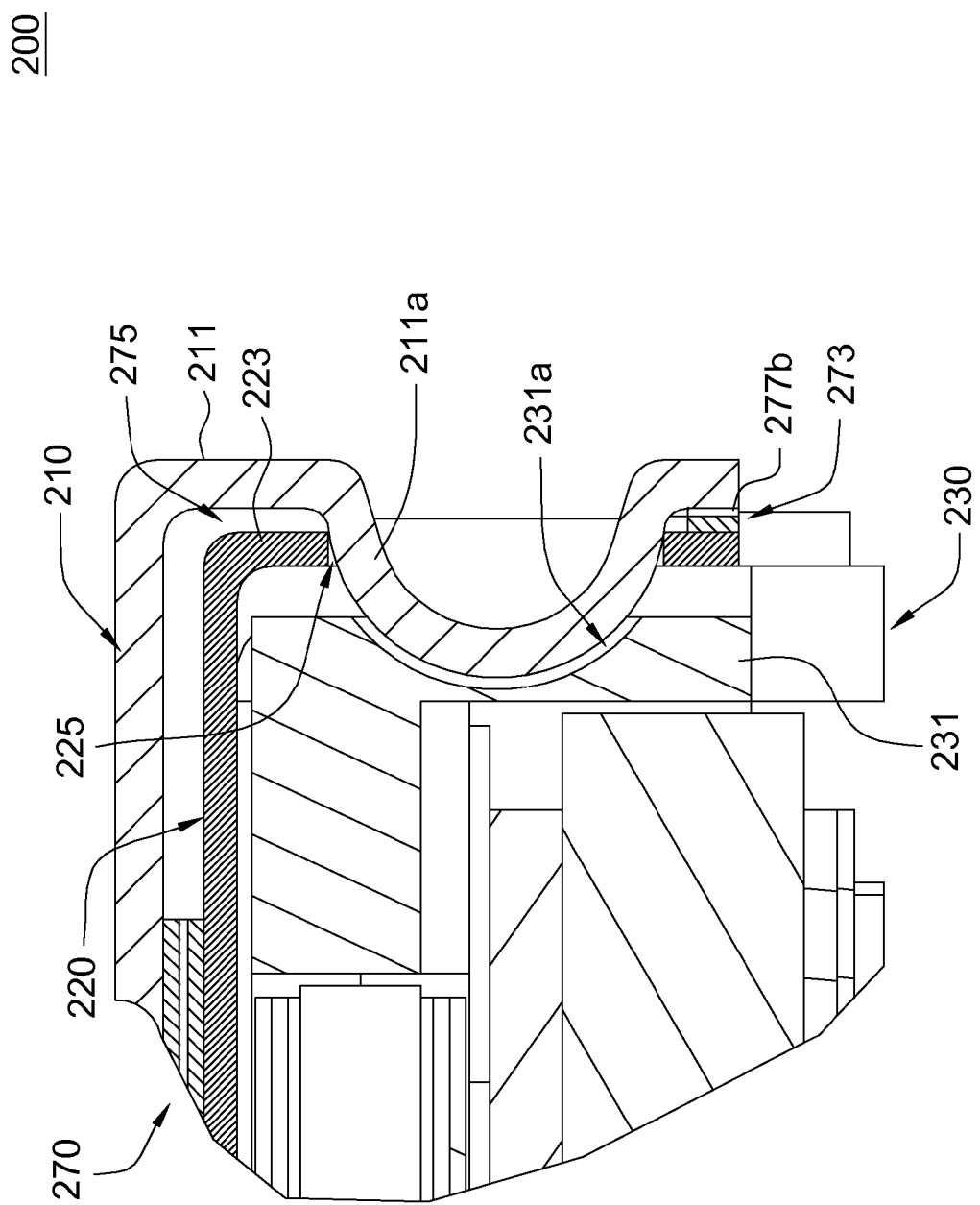
FIG. 6 shows a cross-sectional view of the liquid crystal module in FIG. 5A taken along line 6-6'.

Referring to FIG. 6, a cross-sectional view of the liquid crystal module in FIG. 5A taken along line 6-6' is shown. The grounding portion 273 contacts the inner wall of the side plate 211 of the first conductive casing 210 and an outer wall of the side plate 223 of the second conductive casing 220 concurrently. In the present embodiment of the invention, the grounding portion 273 is grounded with the first conductive casing 210 only, so a metal layer 277b of the grounding portion 273 only contacts the first conductive casing 210. Thus, when electrostatic charges exist in the liquid crystal module 200, the electrostatic charges are discharged through the path formed by the grounding portion 273 of the flexible printed circuit 270 and the first conductive casing 210.

Despite the metal layer 227b is grounded by only contacting the inner wall of the side plate 211 of the first conductive casing 210, the present invention is not limited thereto. According to the design of circuit layouts, the metal layer 227b can be grounded by only contacting the outer wall of the side plate 223 of the second conductive casing 220 or by contacting the inner wall of the side plate 211 of the first conductive casing 210 and the outer wall of the side plate 223 of the second conductive casing 220 concurrently. The disposition relationship between the metal layer 227b, the first conductive casing 210 and the second conductive casing 220 can be achieved through the structural design of the flexible printed circuit 270. As the flexible printed circuit 270 is, for example, a sandwich structure (the metal layer 277b is disposed between two insulation layers), when the metal layer 277b of the grounding portion 273 is provided to contact at least one of the first conductive casing 210 and the second conductive casing 220, the corresponding insulation layer is removed so as to make the metal layer 227b be grounded by contacting at least one of the first conductive casing 210 and the second conductive casing 220.

In the present embodiment of the invention, as indicated in FIG. 5B, the flexible printed circuit 270 has a first hole 275 (which has a strip shape for example), and the second conductive casing 220 has a second hole 225. The position of the second hole 225 corresponds to that of the first hole 275, so that an indentation 231a of the side plate 231 of the frame 230 is exposed from the first hole 275 and the second hole 225. The exposed indentation 231a is used for confirming the position of the flexible printed circuit 270.

As indicated in FIG. 6, the side plate 211 of the first conductive casing 210 has a protrusion 211a. The protrusion 211a protrudes towards the side plate 231 of the frame 230 and passes through the first hole 275 and the second hole 225. The indentation 233a receives the protrusion 211a, so that the flexible printed circuit 270 is firmly fixed in the liquid crystal module 200, and the metal layer 227b is grounded by exactly contacting the first conductive casing 210.

However, the disposition of the first conductive casing 210 and the frame 230 is not limited to the above exemplification. The side plate of the first conductive casing can also have an indentation for receiving a protrusion of the side plate of the frame, for example. The protrusion protrudes towards the side plate of the first conductive casing and passes through the first hole and the second hole. Thus, the flexible printed circuit 270 is firmly fixed in the liquid crystal module and grounded by exactly contacting the first conductive casing.

Despite the present embodiment of the invention includes several grounding portions 273, anyone who is skilled in the art should understand that the number and the position of the grounding portions 273 are not limited to the above exemplification. The grounding portions 273 can be disposed according to circuit layouts and the position where electrostatic charges might be generated, so that the electrostatic charges can be effectively discharged from the liquid crystal module 200 and the lifespan of the liquid crystal module 200 can be increased.

According to the flexible printed circuit and the liquid crystal module using the same disclosed in the above embodiments of the present invention, electrostatic charges exist in the liquid crystal module are discharged through the path formed by the grounding portion of the flexible printed circuit and at least one conductive casing. Thus, the influence of the electrostatic charges on the liquid crystal module can be reduced, so that the lifespan of the liquid crystal module can be prolonged correspondingly. In addition, the conductive casing and the frame are designed for firmly fixing the grounding portion of the flexible printed circuit, so that the grounding portion can exactly contact the conductive casing.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flexible printed circuit used for being disposed between a frame and a conductive casing of a liquid crystal module, wherein the frame comprises a main plate and a side plate which is connected to a side of the main plate, and the flexible printed circuit comprises:
   a body used for being disposed on the main plate of the frame; and
   a grounding portion extending from the body, wherein the grounding portion is bent to a predetermined angle with respect to the body, so that the grounding portion is disposed on the side plate of the frame, and the grounding portion has a metal layer contacting an inner wall of a side plate of the conductive casing;
   wherein the flexible printed circuit has a hole located at the position where the grounding portion is connected to the body.

2. A flexible printed circuit used for being disposed in a liquid crystal module, wherein the liquid crystal module comprises a frame, a first conductive casing and a second conductive casing, the frame, the second conductive casing, the flexible printed circuit and the first conductive casing are stacked in order, the second conductive casing comprises a main plate and a side plate which is connected to a side of the main plate, and the flexible printed circuit comprises:
   a body used for being disposed on the main plate of the second conductive casing; and
   a grounding portion extending from the body, wherein the grounding portion is bent to a predetermined angle with respect to the body, so that the grounding portion is disposed on the side plate of the second conductive casing, the grounding portion has a metal layer, and the metal layer contacts at least one of an inner wall of a side plate of the first conductive casing and an outer wall of the side plate of the second conductive casing;
   wherein the flexible printed circuit has a hole located at the position where the grounding portion is connected to the body.

3. A liquid crystal module, comprising:
   a frame comprising a main plate and a side plate which is connected to a side of the main plate;
   a display panel disposed in the frame;
   a first conductive casing; and
   a flexible printed circuit disposed between the frame and the first conductive casing, wherein the flexible printed circuit comprises:
   a body disposed on the main plate of the frame; and
   a grounding portion having a first end and a second end, wherein the first end of the grounding portion is connected to the body, a part of the grounding portion is bent, so that the second end of the grounding portion is disposed on the side plate of the frame, the grounding portion contacts an inner wall of a side plate of the first conductive casing, and the flexible printed circuit has a first hole located at the position where the first end is connected to the body.

4. The liquid crystal module according to claim 3, wherein the side plate of the frame has an indentation, the side plate of the first conductive casing has a protrusion which protrudes towards the side plate of the frame and passes through the first hole, and the indentation receives the protrusion.

5. The liquid crystal module according to claim 4, further comprising:
   a second conductive casing disposed between the frame and the flexible printed circuit, wherein a side plate of the second conductive casing has a second hole, and the protrusion of the first conductive casing passes through the second hole so as to fix the grounding portion on the side plate of the second conductive casing.

6. The liquid crystal module according to claim 5, wherein the grounding portion has a metal layer, and the metal layer contacts at least one of the inner wall of the side plate of the first conductive casing and an outer wall of the side plate of the second conductive casing.

7. The liquid crystal module according to claim 3, wherein the side plate of the frame has a protrusion which protrudes towards the side plate of the first conductive casing and passes through the first hole, and the side plate of the first conductive casing has an indentation receiving the protrusion.

8. The liquid crystal module according to claim 7, further comprising:
   a second conductive casing disposed between the frame and the flexible printed circuit, wherein a side plate of the second conductive casing has a second hole, and the protrusion of the frame passes through the second hole so as to fix the grounding portion between the second conductive casing and the first conductive casing.

9. The liquid crystal module according to claim 8, wherein the grounding portion has a metal layer, and the metal layer contacts at least one of the inner wall of the side plate of the first conductive casing and an outer wall of the side plate of the second conductive casing.

10. The liquid crystal module according to claim 3, wherein the side plate of the frame has a recess receiving the grounding portion.

* * * * *

UNITED STATES PATENT AND TRADEMARK OFFICE
CERTIFICATE OF CORRECTION

PATENT NO. : 8,009,260 B2
APPLICATION NO. : 12/504730
DATED : August 30, 2011
INVENTOR(S) : Chen et al.

It is certified that error appears in the above-identified patent and that said Letters Patent is hereby corrected as shown below:

Title Page, Item (73) Assignee should be "Wintek Corporation"

Signed and Sealed this
Twenty-ninth Day of May, 2012

David J. Kappos
*Director of the United States Patent and Trademark Office*